United States Patent
Alberi et al.

(10) Patent No.: US 9,543,468 B2
(45) Date of Patent: Jan. 10, 2017

(54) HIGH BANDGAP III-V ALLOYS FOR HIGH EFFICIENCY OPTOELECTRONICS

(75) Inventors: Kirstin Alberi, Denver, CO (US); Angelo Mascarenhas, Lakewood, CO (US); Mark Wanlass, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 683 days.

(21) Appl. No.: 13/878,738

(22) PCT Filed: Oct. 12, 2011

(86) PCT No.: PCT/US2011/055994
§ 371 (c)(1),
(2), (4) Date: Apr. 10, 2013

(87) PCT Pub. No.: WO2012/051324
PCT Pub. Date: Apr. 19, 2012

(65) Prior Publication Data
US 2013/0221326 A1  Aug. 29, 2013

Related U.S. Application Data

(60) Provisional application No. 61/392,406, filed on Oct. 12, 2010.

(51) Int. Cl.
*H01L 33/04* (2010.01)
*H01L 33/00* (2010.01)
(Continued)

(52) U.S. Cl.
CPC ............ *H01L 33/04* (2013.01); *H01L 33/005* (2013.01); *H01L 33/0066* (2013.01); *H01L 33/12* (2013.01); *H01L 33/305* (2013.01)

(58) Field of Classification Search
CPC ........ B82Y 20/00; H01L 33/04; H01L 33/005;
H01L 33/12; H01L 33/305; H01L
33/0066; H01L 33/32; H01L
33/06; H01L 33/007; H01L 33/08; H01L
33/0079; H01L 21/0254
(Continued)

(56) References Cited

U.S. PATENT DOCUMENTS 3,900,868 A   8/1975   Bock et al.
4,214,916 A   7/1980   Felsher et al.
(Continued)

FOREIGN PATENT DOCUMENTS

EP   0157602     10/1985
JP   H04212479   8/1992
(Continued)

OTHER PUBLICATIONS

Aiken, "Antireflection Coating Design for Series Interconnected Multi-junction Solar Cells," Progress in Photovltaics: Research and Applications, vol. 8, Issue 6, Nov./Dec. 2000, pp. 563-570.

(Continued)

*Primary Examiner* — John C Ingham
*Assistant Examiner* — Didarul Mazumder
(74) *Attorney, Agent, or Firm* — Michael A. McIntyre

(57) ABSTRACT

High bandgap alloys for high efficiency optoelectronics are disclosed. An exemplary optoelectronic device may include a substrate, at least one $Al_{1-x}In_xP$ layer, and a step-grade buffer between the substrate and at least one $Al_{1-x}In_xP$ layer. The buffer may begin with a layer that is substantially lattice matched to GaAs, and may then incrementally increase the lattice constant in each sequential layer until a predetermined lattice constant of $Al_{1-x}In_xP$ is reached.

20 Claims, 2 Drawing Sheets

(51) Int. Cl.
  *H01L 33/12* (2010.01)
  *H01L 33/30* (2010.01)
  *H01L 33/32* (2010.01)
  *B82Y 20/00* (2011.01)

(58) Field of Classification Search
  USPC .............................................. 257/13; 438/22
  See application file for complete search history.

(56) References Cited

U.S. PATENT DOCUMENTS

| | | | |
|---|---|---|---|
| 4,214,946 A | 7/1980 | Forget et al. | |
| 4,255,211 A | 3/1981 | Fraas | |
| 4,278,474 A | 7/1981 | Blakeslee et al. | |
| 4,338,480 A | 7/1982 | Antypas et al. | |
| 4,881,979 A | 11/1989 | Lewis | |
| 4,963,508 A | 10/1990 | Umeno et al. | |
| 4,963,949 A | 10/1990 | Wanlass | |
| 5,002,618 A | 3/1991 | Kanai et al. | |
| 5,019,177 A | 5/1991 | Wanlass | |
| 5,053,083 A | 10/1991 | Sinton | |
| 5,079,184 A | 1/1992 | Hatano et al. | |
| 5,138,416 A * | 8/1992 | Brillson | H01L 27/14868 |
| | | | 250/226 |
| 5,185,288 A | 2/1993 | Cook et al. | |
| 5,261,969 A | 11/1993 | Stanbery | |
| 5,264,389 A | 11/1993 | Hamada et al. | |
| 5,322,572 A | 6/1994 | Wanlass | |
| 5,376,185 A * | 12/1994 | Wanlass | H01L 31/02168 |
| | | | 136/262 |
| 5,377,616 A | 1/1995 | Mihira et al. | |
| 5,403,916 A | 4/1995 | Watanabe et al. | |
| 5,407,491 A | 4/1995 | Freundlich et al. | |
| 5,455,429 A | 10/1995 | Paoli et al. | |
| 5,479,032 A | 12/1995 | Forrest et al. | |
| 5,497,032 A | 3/1996 | Tsuji et al. | |
| 5,571,339 A | 11/1996 | Ringel et al. | |
| 5,714,014 A | 2/1998 | Horikawa | |
| 5,716,459 A | 2/1998 | Chang et al. | |
| 5,744,829 A | 4/1998 | Murasato et al. | |
| 5,853,497 A | 12/1998 | Lillington et al. | |
| 5,865,906 A | 2/1999 | Ferguson et al. | |
| 5,944,913 A | 8/1999 | Hou et al. | |
| 5,959,307 A | 9/1999 | Nakamura et al. | |
| 6,002,142 A | 12/1999 | Paoli | |
| 6,034,321 A | 3/2000 | Jenkins | |
| 6,100,546 A | 8/2000 | Major et al. | |
| 6,107,562 A | 8/2000 | Hashimoto et al. | |
| 6,150,604 A | 11/2000 | Freundlich et al. | |
| 6,162,768 A | 12/2000 | Coolbaugh et al. | |
| 6,162,987 A | 12/2000 | Murray et al. | |
| 6,180,432 B1 | 1/2001 | Freeouf | |
| 6,218,607 B1 | 4/2001 | Mulligan et al. | |
| 6,232,138 B1 | 5/2001 | Fitzgerald et al. | |
| 6,239,354 B1 | 5/2001 | Wanlass | |
| 6,252,287 B1 | 6/2001 | Kurtz et al. | |
| 6,255,580 B1 | 7/2001 | Karam et al. | |
| 6,265,653 B1 | 7/2001 | Haigh et al. | |
| 6,281,426 B1 | 8/2001 | Olson et al. | |
| 6,300,557 B1 | 10/2001 | Wanlass | |
| 6,300,558 B1 | 10/2001 | Takamoto et al. | |
| 6,316,715 B1 | 11/2001 | King et al. | |
| 6,340,788 B1 | 1/2002 | King et al. | |
| 6,420,732 B1 | 7/2002 | Kung et al. | |
| 6,482,672 B1 | 11/2002 | Hoffman et al. | |
| 6,489,639 B1 * | 12/2002 | Hoke | H01L 21/28587 |
| | | | 257/194 |
| 6,566,688 B1 | 5/2003 | Zhang et al. | |
| 6,660,928 B1 | 12/2003 | Patton et al. | |
| 6,680,432 B2 | 1/2004 | Sharps et al. | |
| 6,743,974 B2 | 6/2004 | Wada et al. | |
| 6,815,736 B2 | 11/2004 | Mascarenhas | |
| 6,917,061 B2 | 7/2005 | Pan et al. | |
| 6,951,819 B2 | 10/2005 | Iles et al. | |
| 6,987,286 B2 | 1/2006 | McGill et al. | |
| 7,005,682 B2 | 2/2006 | Ohta et al. | |
| 7,095,050 B2 | 8/2006 | Wanlass et al. | |
| 7,309,832 B2 | 12/2007 | Friedman et al. | |
| 7,329,554 B2 | 2/2008 | Hanna et al. | |
| 7,488,890 B2 | 2/2009 | Takamoto et al. | |
| 7,633,083 B2 | 12/2009 | Lester et al. | |
| 7,675,077 B2 | 3/2010 | Shei et al. | |
| 7,692,182 B2 | 4/2010 | Bergmann et al. | |
| 7,701,991 B2 | 4/2010 | Bean et al. | |
| 7,807,980 B2 | 10/2010 | Shishido et al. | |
| 8,063,397 B2 | 11/2011 | Mori et al. | |
| 8,067,687 B2 | 11/2011 | Wanlass | |
| 8,173,891 B2 | 5/2012 | Wanlass et al. | |
| 8,735,202 B2 | 5/2014 | Wanlass | |
| 8,772,623 B2 | 7/2014 | Wanlass et al. | |
| 8,772,628 B2 | 7/2014 | Wanlass et al. | |
| 2001/0000005 A1 * | 3/2001 | Forrest | C09K 11/06 |
| | | | 204/192.12 |
| 2001/0013609 A1 | 8/2001 | Abe | |
| 2002/0062858 A1 | 5/2002 | Mowles | |
| 2002/0104996 A1 * | 8/2002 | Kuo | H01L 33/0062 |
| | | | 257/79 |
| 2002/0129762 A1 | 9/2002 | Bulsara et al. | |
| 2003/0015700 A1 | 1/2003 | Eisenbeiser et al. | |
| 2003/0160251 A1 | 8/2003 | Wanlass | |
| 2003/0183816 A1 * | 10/2003 | Okano | C30B 25/02 |
| | | | 257/13 |
| 2004/0099872 A1 * | 5/2004 | McGill | B82Y 20/00 |
| | | | 257/94 |
| 2004/0166681 A1 | 8/2004 | Iles et al. | |
| 2004/0206389 A1 | 10/2004 | Takamoto et al. | |
| 2005/0274411 A1 | 12/2005 | King et al. | |
| 2006/0017063 A1 * | 1/2006 | Lester | H01L 21/02381 |
| | | | 257/190 |
| 2006/0049415 A1 | 3/2006 | Liao et al. | |
| 2006/0112986 A1 | 6/2006 | Atwater, Jr. et al. | |
| 2006/0144435 A1 | 7/2006 | Wanlass | |
| 2006/0162768 A1 | 7/2006 | Wanlass et al. | |
| 2006/0166475 A1 | 7/2006 | Mantl | |
| 2006/0185582 A1 | 8/2006 | Atwater, Jr. et al. | |
| 2006/0220032 A1 | 10/2006 | Arai et al. | |
| 2007/0002915 A1 | 1/2007 | Bean et al. | |
| 2007/0029915 A1 | 2/2007 | Kim et al. | |
| 2007/0151595 A1 | 7/2007 | Chiou et al. | |
| 2007/0277869 A1 | 12/2007 | Shan et al. | |
| 2008/0149915 A1 | 6/2008 | Mori et al. | |
| 2008/0164486 A1 * | 7/2008 | Hosomi | H01L 33/0079 |
| | | | 257/94 |
| 2008/0200020 A1 | 8/2008 | Krull et al. | |
| 2008/0277647 A1 * | 11/2008 | Kouvetakis | B82Y 20/00 |
| | | | 257/19 |
| 2009/0045437 A1 * | 2/2009 | Sandhu | H01L 21/02392 |
| | | | 257/190 |
| 2009/0078308 A1 | 3/2009 | Varghese et al. | |
| 2009/0146163 A1 | 6/2009 | Cheng et al. | |
| 2009/0206322 A1 * | 8/2009 | Brandes | H01L 25/0753 |
| | | | 257/13 |
| 2009/0229659 A1 | 9/2009 | Wanlass et al. | |
| 2009/0288703 A1 | 11/2009 | Stan et al. | |
| 2009/0309111 A1 | 12/2009 | Grillot et al. | |
| 2010/0270568 A1 * | 10/2010 | Suzuki | H01L 33/02 |
| | | | 257/96 |
| 2011/0090689 A1 * | 4/2011 | Park | H01L 33/42 |
| | | | 362/235 |
| 2011/0186115 A1 | 8/2011 | Wanlass et al. | |
| 2012/0032187 A1 | 2/2012 | Mascarenhas et al. | |

FOREIGN PATENT DOCUMENTS

| | | |
|---|---|---|
| JP | H05291617 | 11/1993 |
| JP | 11-163380 | 6/1999 |
| JP | 2003-347582 | 12/2003 |
| JP | 2006080525 | 3/2006 |
| JP | 2006332228 | 12/2006 |
| JP | 2006352089 | 12/2006 |
| WO | 03100868 | 12/2003 |
| WO | 2004017425 | 2/2004 |
| WO | 2004022820 | 3/2004 |

(56) References Cited

FOREIGN PATENT DOCUMENTS

| WO | 2006106467 | 10/2006 |
|---|---|---|
| WO | WO 2009/139935 | 11/2009 |
| WO | WO 2010/121057 | 10/2012 |

OTHER PUBLICATIONS

Kim et al., "Visible Light-emitting Diodes Grown on Optimized ?[InxGa1-x]P/GaP Epitaxial Transparent Substrates with Controlled Dislocation Density," Journal of Electronic Materials, vol. 29, Issue 8, Aug. 2000, pp. L9-L12.

Lamorte et al., "Comuter Modeling of a Two-Junction, Monolithic Cascade Solar Cell," IEEE Transactions on Electron Devices, vol. ED-27, No. 1, Jan. 1980, pp. 231-249.

Lee et al., "Disorder/order/disorder Ga0.5In0.5P visible light-emitting diodes," Journal of Applied Physics, vol. 72, Issue 11, Dec. 1, 1992, pp. 5420-5422.

Sinharoy et al., "Progress in the Development of Metamorphic Multi-junction III-V Space Solar Cells," Porgress in Photovoltaics: Research and Applications, vol. 10, Issue 6, Sep. 2002, pp. 427-432.

Wanlass et al., "Lattice-Mismatched Approaches for High-Performance, III-V Photovoltaic Energy Converters," NREL/CP-520-37440, 31st IEEE Photovoltaics Specialists Conference and Exhibition, Lake Buena Vista, Florida, Jan. 3-7, 2005.

Wehrer et al., "0.74/0.55-eV GaxIn1-xAs/InAsYP1-Y Monolithic, Tandem, MIM TPV Converters: Design, Growth, Processing and Performance," 29th IEEE Photovoltaics Specialists Conference and Exhibition, May 2002, New Orleans, Louisiana.

Yablonovitch et al., "Extreme selectivity in the lift-off of epitaxial GaAs films," Applied Physics Letters, vol. 51, Issue 26, Dec. 28, 1987, pp. 2222-2224.

Zhang et al., "An UV photochromic memory effect in proton-based WO3 electrochromic devices," Applied Physics Letters, vol. 93, Issue 20, Nov. 17, 2008, pp. 203508-1-203508-2.

Zhang, "Non-Bloch Nature of Alloy States in a Conventional Semiconductor Alloy: GaxIn1-xP as an Example", Physical Review Letters, vol. 101, Issue 3, Jul. 18, 2008, pp. 036403-1-036403-4.

Zhang et al. "Tailoring the electronic properties of GaxIn1-xP beyond simply varying alloy composition," Applied Physics Letters, vol. 94, Issue 9, Mar. 2, 2009, pp. 091113-1-091113-3.

Aiken, "High performance anti-reflection coatings for broadband multi-junction solar cells," Solar Energy Materials and Solar Cells, vol. 64, Issue 4, Nov. 2000, pp. 393-404.

Tixier et al., "Molecular beam epitaxy growth of GaAs1-xBix," Applied Physics Letters, vol. 82, Issue 14, Apr. 7, 2003, pp. 2245-2247.

Halsall et al., "Electron diffraction and Raman studies of the effect of substrate misorientation on ordering in the AlGaInP system," Journal of Applied Physics, vol. 85, Issue 1, Jan. 1, 1999, pp. 199-202.

Xin et al., "GaN0.011P0.989 red light-emitting diodes directly grown on GaP substrates," Applied Physics Letters, vol. 77, Issue 13, Sep. 25, 2000, pp. 1946-1308.

Biwa et al., "Metalorganic vapor-phase epitaxy of GaP1-x-yAsy/Nx quaternary alloys on GaP," Journal of Crystal Growth vols. 189/190, Jun. 15, 1998, pp. 485-489.

McConnell et al., "Photovoltaics for the 21st Century II" Energy Technology Division, Proceedings, vol. 2001-10, The Electrochemical Society, Inc.

Hong et al., "Ga(In)NAs and (Al)GaNP: Potential Materials for Photovoltaics," Electrochemical Society Proceedings vol. 2001-10, pp. 415-423.

Xin et al., "Gas-source MBE growth of Ga(In)Np/GaP structures and their applications for red light-emitting diodes," Journal of Crystal Growth, vols. 227-228, Jul. 2001, pp. 558-561.

Yamada et al, "Ion implantation of isoelectronic impurities into Inp," Nuclear Instruments and Methods in Physics Research B, 1993, 910-914, North Holland.

Ahrenkiel et al., "Characterization Survey of GaxIn1/InAsyP1-y Double Heterostructures and InAsy_1-y Multilayers Gorwn on InP," Journal of Electronic Materials, vol. 33, No. 3, Mar. 2004, pp. 185-193.

Barnett et al., "Very High Efficiency Solar Cell Modules, Progress in Photovoltaics: Research and Applications," vol. 17, Issue 1, Jan. 2009, pp. 75-83.

Geisz, et al., "High-efficiency GaInP/GaAs/InGaAs triple-junction solar cells grown inverted with a metamorphic bottom junction", Applied Physics Letters, vol. 91, Issue 2, Jul. 9, 2007, pp. 023502-1-023502-3.

Geisz, et al., "40.8% efficient inverted triple-junction solar cell with two independently metamorphic junctions", Applied Physics Letters, vol. 93, Issue 12, Sep. 22, 2008, pp. 123505-1-123505-3.

King, et al., "40% efficient metamorphic GaInP/GaInAs/Ge multijunction solar cells", Applied Physics Letters, vol. 90, Issue 18, Apr. 30, 2007, pp. 183516-1-183516-3

Kurtz et al., "Effect of growth rate on the band gap of Ga0.5In0.5P", Applied Physics Letters, Oct. 29, 1990, vol. 57, No. 29, pp. 1922-1924.

Mascarenhas et al., "The Physics of Tunable Disorder in Semiconductor Alloys", from Spontaneous Ordering in Semiconductor Alloys, 2002, Chapter 11, pp. 283-327.

Olson et al., "A 27.3% efficient Ga0.5In0.5P/GaAs tandem solar cell", Applied Physics Letters, Feb. 7, 1990, vol. 56, No. 7, pp. 623-625.

Suzuki, "Basic Aspects of Atomic Ordering in III-V Semiconductor Alloys", from Spontaneous Ordering in Semiconductor Alloys, 2002, Chapter 1, pp. 1-42.

Wei, "Effects of Ordering on Physical Properties of Semiconductor Alloys", from Spontaneous Ordering in Semiconductor Alloys, 2002, Chapter 15, pp. 423-450.

Zhang et al., "Interplay of alloying and ordering on the electronic structure of GaxIn1-xP alloys", Physical Review B, Dec. 15, 2008, vol. 78, No. 23, pp. 235202-1-235202-8.

International Search Report for PCT/US2010/031279 application mailed on Jun. 16, 1010.

Written Opinion for PCT/US2010/031279 application mailed on Jun. 16, 2010.

International Preliminary Report on Patentability for PCT/US2010/031279 application issued Oct. 18, 2011.

Wanlass, et al., "A Rigorous Analysis of Series-Connected, Multi-Bandgap, Tandem Thermophotovoltaic (TPV) Energy Converters," Proc. Sixth Conference on Thermophotovoltaic Generation of Electricity (TPV6), Jun. 14-16, 2004, pp. 462-470.

Zahler, et al., "Wafer Bonding and Layer Transfer Processes for 4-Junction High Efficiency Solar Cells", Proceedings of the 29th IEEE Photovoltaic Specialists Conference, May 2002, pp. 1039-1042 New Orleans, LA.

Venkatasubramanian et al., "An Inverted-Growth Approach to Development of an IR-Transparent, High-Efficiency AlGaAs/GaAs Cascade Solar Cell," Conf. Record of the 22nd IEEE Photovoltaic Specialists Conference, Oct. 7-11, 1991, pp. 93-98.

Li U et al., "Electrochemical performance of α-Fe2O3 nanorods as anode material for lithium-ion cells," Electrchimica Acta, vol. 54, Issue 6, Feb. 2009, pp. 1733-1736.

Mols, et al., "Development of Metamorphic Dual-Junction Solar Cells," 22nd European Photovoltaic Energy Conference, Sep. 3-7, 2007, pp. 765-768, Milan Italy.

Tang, et al., "Effect of rapid thermal annealing on the ordering of AlInP grown by metal-organic vapor-phase epitaxy," Applied Physics Letters, vol. 87, Issue 18, Oct. 31, 2005, pp. 181906-1-181906-3.

U.S. Appl. No. 13/262,509 Non-Final Rejection dated Aug. 15, 2013.

U.S. Appl. No. 13/262,509 Applicant Initiated Interview Summary dated Feb. 12, 2014.

U.S. Appl. No. 13/262,509 Notice of Allowance and Fees Due dated Jun. 6, 2014.

Vurgaftman et al., "Band parameters for III-V compound semiconductors and their alloys," Applied Physics Review, vol. 89, Issue 11, Jun. 1, 2001, pp. 5815-5875.

(56) References Cited

OTHER PUBLICATIONS

Bhusal et al., "Ordering induced direct-indirect transformation in unstrained GaxIn1-xP for $0.76 \leq x \leq 0.78$" Journal of Applied Physics, 2009, vol. 106, pp. 114909-1-114909-3.
Fujimoto et al., "Dislocation-free GaAsyP1-x-yNx/GaP0.98N0.02 quantum-well structure lattice-matched to a Si substrate", Applied Physics Letters, vol. 79, No. 9 Aug. 27, 2001, pp. 1306-1308.
Murray et al., "MOCVD growth of lattice-matched and mismatched InGaAs materials for thermophotovoltaic energy conversion", Semiconductor Science and Technology, 2003, vol. 18, pp. S202-S208.
International Search Report for International (PCT) Application No. PCT/US02/16101, mailed Sep. 6, 2002.
Written Opinion for for International (PCT) Application No. PCT/US02/16101, mailed Apr. 6, 2004.
International Search Report for PCT/US2009/032480 dated Nov. 19, 2009.
International Preliminary Examination Report for International (PCT) Application No. PCT/US02/16101, mailed Aug. 30, 2004.
Written Opinion of the International Search Authority for PCT/US2009/032480 dated Nov. 15, 2010.
International Preliminary Report on Patentability for PCT/US2009/032480 dated Nov. 17, 2010.
International Search Report and Written Opinion for International (PCT) Application No. PCT/US2011/055994, mailed Jan. 24, 2012, pp. 1-8.

\* cited by examiner

HIGH BANDGAP III-V ALLOYS FOR HIGH EFFICIENCY OPTOELECTRONICS

CROSS-REFERENCE TO RELATED APPLICATIONS

This application claims the benefit of U.S. Provisional Application No. 61/392,406, filed Oct. 12, 2010, which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

The described subject matter relates to high bandgap phosphide-based III-V alloys for high efficiency optoelectronic devices by limiting intervalley carrier transfer.

One approach to achieving high efficiency white light emitting diodes (LEDs) is to combine individual red, green and blue LEDs (the so-called "RGB approach"). Such a device has a high color rendering index (CRT) for LED architecture, but requires that each of the individual LEDs also have high quantum efficiencies, defined as the ratio of emitted photons to electrons injected into the device. Both red and blue LEDs have already reached the necessary efficiencies, but green emission remains relatively inefficient. The desired green emission wavelength for a three-color mixing scheme is approximately 560 nm, which maximizes the CRI and relaxes the requirements for the red and blue emission as well. For a four color mixing scheme, an amber wavelength of approximately 575-590 nm may also be desired.

Historically, green-emitting LEDs have been based on the $Ga_{1-x}In_xN$ and $(Al_xGa_{1-x})_yIn_{1-y}P$ alloys systems, in order to reach direct band gaps of $E_g \sim 2.1$-2.3 eV (at wavelengths $\lambda \sim 540$-590 nm). More recent efforts have also focused on using $Ga_xIn_{1-x}P$ alloys for this application as well. The nitride-based alloys are currently the only III-V alloy system suitable for short wavelength emission ($\lambda < 520$ nm) since GaN has a direct bandgap in the UV ($E_g = 3.5$ eV). The addition of In to GaN effectively translates the emission into the blue range, but further reduction of the gap into the green is accompanied by a severe reduction in emission efficiency. It is quite difficult to grow nitride-based semiconductors as freestanding substrates, therefore requiring the fabrication of $Ga_{1-x}In_xN$ devices on foreign substrates that are not appropriately lattice-matched.

Conversely, $(Al_xGa_{1-x})_yIn_{1-y}P$ is lattice-matched in GaAs for $y \sim 0.51$, allowing for good material quality, and is the primary material system used for red and orange LEDs. However, the lattice-matched system is predicted to undergo a direct to indirect bandgap transition around 2.2-2.3 eV at approximately $x=0.53$, depending on the degree of spontaneous atomic ordering. Since photon emission is much less likely when the bandgap is indirect, $(Al_xGa_{1-x})_{0.51}In_{0.49}P$ cannot be used for LEDs operating at wavelengths below 560 nm. Furthermore, when considering that the bandgap must be several kT (~100 meV) below the transition energy to prevent intervalley transfer of carriers to the X and L bands, which also lowers the emission efficiency, this alloy is capable of operating at high efficiency only up to the yellow-green edge of the spectrum (~2.1 eV). $Ga_xIn_{1-x}P$ (no Al), that is slightly lattice-mismatched from GaAs, is also a candidate for green LEDs, but is also limited to similar wavelengths.

The foregoing examples of the related art and limitations related therewith are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

High bandgap alloys for high efficiency optoelectronics are disclosed. An exemplary LED device comprises at least one $Al_{1-x}In_xP$ layer and a virtual substrate, which comprises a substrate and a compositionally-graded buffer between the substrate and the at least one $Al_{1-x}In_xP$ layer. The buffer starts with a layer that is closely, but not necessarily exactly, lattice matched to GaAs, and then incrementally or otherwise increases the lattice constant in each sequential layer until a predetermined lattice constant of $Al_{1-x}In_xP$ is reached. The design of the buffer will depend on a variety of factors, including the device design and growth conditions.

In addition to the exemplary aspects and embodiments described above, further aspects and embodiments will become apparent by reference to the drawings and by study of the following descriptions.

Figure 1:
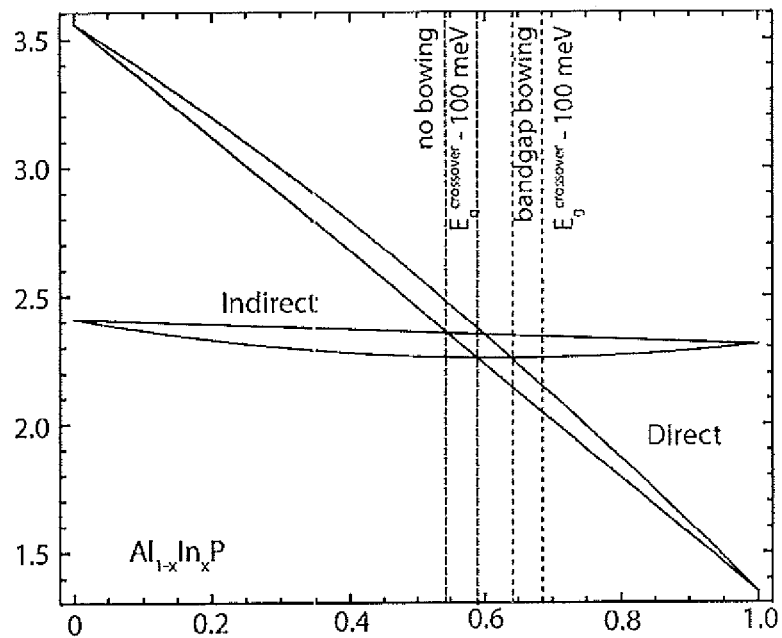
FIG. 1 is a plot of direct and indirect bandgap energies of $Al_{1-x}In_xP$ alloys calculated with and without bandgap bowing. Compositions associated with the direct to indirect cross-over ($E_g^{cross-over}$) and $E_g^{crossover}-100$ meV are marked.

$Al_{1-x}In_xP$ may be used according to the embodiments described herein for green LEDs, as this material undergoes a transition from a direct to indirect gap semiconductor at the highest energy of any of the non-nitride III-V alloys. The energy at which the transition occurs may be in the range of 2.4 eV ($x \sim 0.54$ assuming no bandgap bowing) to 2.3 eV ($x \sim 0.63$, assuming a small bandgap bowing of $b_r \sim -0.48$ eV and $b_x \sim -0.38$ eV [1]), as shown in FIG. 1. Accounting for the bandgap reduction necessary to prevent intervalley carrier transfer, photon emission in the 2.1-2.3 eV range (540-590 nm) is possible.

Figure 2:
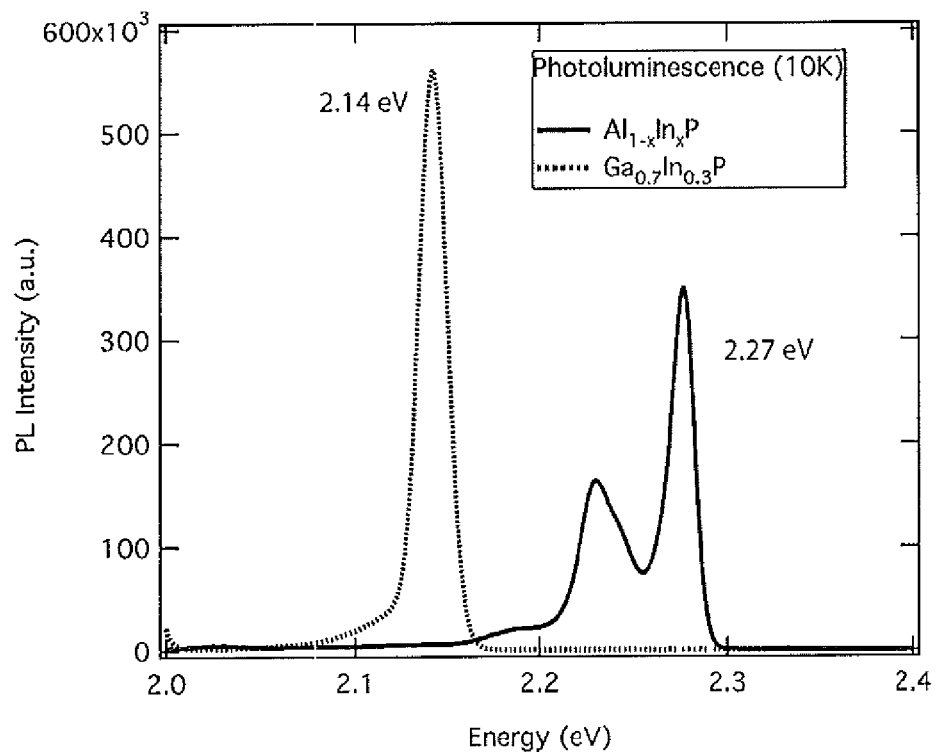
FIG. 2 is a plot comparing the peak emission energies of $Al_{1-x}In_xP$ vs $Ga_{0.7}In_{0.3}P$ showing that the direct bandgap of $Al_{1-x}In_xP$ is in the green range.

FIG. 2 shows a photoluminescence spectrum of an unoptimized 1 μm $Al_{0.4}In_{0.6}P$ film grown by metal-organic chemical vapor deposition on a GaAs substrate, demonstrating the ability to achieve direct gaps at approximately 2.27 eV (at 10 K). A spectrum of $Ga_{0.7}In_{0.3}P$ grown on a GaAs substrate ($E_g$=2.14 eV) is also shown for comparison and highlights the advantage of $Al_{1-x}In_xP$ over $Ga_{1-x}In_xP$ to reach green emission wavelengths.

At the compositions at which the bandgap is direct, $Al_{1-x}In_xP$ is not lattice matched to GaAs (a=5.65 Å). Tables 1 and 2 (below) show the calculated relevant emission energies, lattice constants and lattice mismatch to GaAs for the above-mentioned alloys. Tables 1 and 2 show calculated/estimated values, the values shown are included merely as a guide. Other values are anticipated and the values may vary, depending on the design choices or other circumstances. The strain in a pseudomorphic $Al_{1-x}In_xP$ layer is calculated to be between 0.005 and 0.016, which will have a tendency to relax as the film exceeds the critical thickness via the formation of misfit and threading dislocations. Retaining some amount of strain may benefit the device by slightly pushing the direct gap higher in energy toward the ideal emission wavelength. However, by inserting a compositionally-graded buffer layer between the substrate and $Al_{1-x}In_xP$ device layers to form a virtual substrate, the $Al_{1-x}In_xP$ can be grown virtually strain free, if its relaxed lattice constant is matched to the in-plane lattice constant at the termination of the buffer layer.

TABLE 1

Emission and lattice constant information on $Al_{1-x}In_xP$ alloys suitable for green emission.

| x | Emission energy (eV) | Emission λ (nm) | Lattice constant, a (Å) | ΔaGaAs (Å) | Lattice Mismatch |
|---|---|---|---|---|---|
| No bandgap bowing ||||||
| 0.54 | 2.39 | 523 | 5.68 | 0.03 | 0.0053 |
| 0.58 | 2.27 | 547 | 5.70 | 0.05 | 0.0088 |
| Assuming bandgap bowing ||||||
| 0.63 | 2.19 | 567 | 5.72 | 0.07 | 0.0124 |
| 0.68 | 2.09 | 594 | 5.74 | 0.09 | 0.0159 |

TABLE 2

Composition of $Ga_{1-x}In_xAs$ and $GaBi_xAs_{1-x}$ buffer layers lattice-matched to $Al_{1-x}In_xP$.

| x ($Al_{1-x}In_xP$) | aAlInP (Å) | x ($Ga_{1-x}In_xAs$) | x ($GaBi_xAs_{1-x}$) |
|---|---|---|---|
| No bandgap bowing ||||
| 0.54 | 5.68 | 0.07 | 0.05 |
| 0.58 | 5.70 | 0.12 | 0.08 |
| Assuming bandgap bowing ||||
| 0.63 | 5.72 | 0.17 | 0.11 |
| 0.68 | 5.74 | 0.22 | 0.15 |

If a step-graded buffer layer is used, it typically first starts with a layer that is substantially lattice matched to GaAs, and then increases the lattice constant by a small amount in each sequential layer until the desired in-plane lattice constant of the graded layer matches the desired relaxed lattice constant of $Al_{1-x}In_xP$. The buffer layer may alternatively consist of a continuous compositional grade rather than defined steps. A portion of the overall strain is relaxed in each layer of the step-graded buffer layer. The dislocations formed during the strain relaxation are ideally largely confined to these layers, and the $Al_{1-x}In_xP$ device layers can then be grown with significantly reduced dislocation densities (~$10^5$-$10^6$ cm$^{-2}$). It should be noted that the top layer of the buffer may still contain some residual strain, so the strained in-plane lattice constant of the buffer layer should be matched to the strain-free lattice constant of the $Al_{1-x}In_xP$ layer. For the strain-mismatch values shown in Table 1, an estimated 3-8 step-graded buffer layers may be used. As an additional benefit of using $Al_{1-x}In_xP$ over $Ga_yIn_{1-y}P$, growth occurs in compression ($a_{film}$>$a_{substrate}$) rather than tension ($a_{film}$<$a_{substrate}$), which is favorable for growth.

Several alloys are well suited for the compositionally-graded buffer layer, including $Al_{1-x}In_xP$ itself, $Ga_{1-x}In_xAs$, $GaSb_xAs_{1-x}$, $GaBi_xAs_{1-x}$, or any other III-V alloy that spans the range of lattice constants between the substrate and $Al_{1-x}In_xP$ layer. For the $Al_{1-x}In_xP$ step-graded buffer layer, an $Al_{0.51}In_{0.49}P$ layer that is closely lattice-matched to GaAs is first grown (substantially lattice-matched to GaAs) and then the In concentration may be increased in the subsequent layers. This approach is advantageous since the valence and conduction band edge energies of these layers are favorably aligned to those of the final $Al_{1-x}In_xP$ device layers, such that they prevent electron or hole diffusion to the GaAs substrate. Growth of high quality $Ga_{1-x}In_xAs$ step-grades spanning wide In concentrations are also an option. The amount of In added to GaAs to shift the lattice constant to the desired value for $Al_{1-x}In_xP$ ranges from x~0.075 ($Al_{0.46}In_{0.54}P$, a=5.68 Å) to x~0.225 ($Al_{0.32}In_{0.68}P$, a=5.74 Å). This may include a graded layer overshoot to account for residual strain in the compositionally graded buffer, where the in-plane lattice constant at the termination of the buffer is matched to the desired relaxed lattice constant of the $Al_{1-x}In_xP$ device layer.

Grading the In out to a value of x~0.075 may be achieved in three 0.5 μm steps with increasing In concentration, although the exact design of the buffer layers will depend on many factors. Finally, relaxation of $GaBi_xAs_{1-x}$ does not appear to result in the formation of threading dislocations. The potential for reducing the number of threading dislocations that could propagate to the $Al_{1-x}In_xP$ active layer during growth is an advantage to using $GaBi_xAs_{1-x}$ as a buffer layer.

Other substrates could be substituted for GaAs, including Si, Ge and GaP. The use of Ge is favorable because Ge has a slightly larger lattice constant of 5.6578 Å vs 5.6532 Å (0.08% mismatched), which reduces some mismatch. Grading out to the $Al_{1-x}In_xP$ lattice constant may be achieved with $Si_xSn_yGe_{1-x-y}$. If the buffer layer is not able to reduce the threading dislocation density in the active layer to acceptable levels, a small amount of Ga may be added to $Al_{1-x}In_xP$, forming $Al_{1-x-y}In_xGa_yP$, to push the lattice constant back toward, but not equal to, that of GaAs. This results in a reduction of the energy at which the direct to indirect gap transition occurs, but the trade-off may be worthwhile in some embodiments. Reduced Al concentrations may also be advantageous. InP may also be an acceptable substrate on which to grow the compositionally graded buffer and $Al_{1-x}In_xP$ device layers if it appears beneficial for enabling certain LED design aspects. Materials similar to those outlined above for GaAs could be used for the compositionally graded buffer.

Design of the LED device may include any existing variant for which light extraction, internal quantum efficiency, peak power, heat dissipation etc. are optimized. In the scheme of a double heterostructure (p-i-n or n-i-p variations), the active region may include n and p-type doped layers, or an intrinsically doped layer. The cladding layers may be designed through a number of approaches.

In an example embodiment, n and p-type doped $Al_{1-x}In_xP$ layers of higher Al concentration, and therefore higher bandgap, than the active layers may be used to confine carriers to the active region through a type I band alignment. $Al_{1-x}In_xP$ has a strong tendency for Al and In to order on the group III sub-lattice, which strongly reduces the bandgap.

Figure 3:
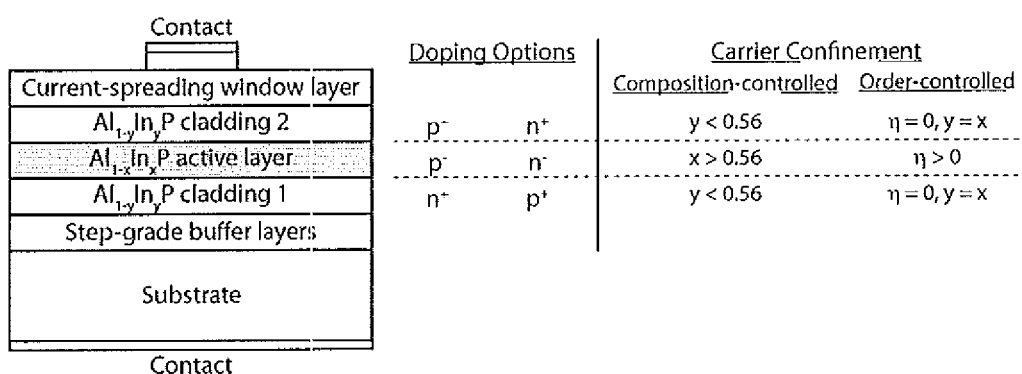
FIG. 3 illustrates an example of a double heterostructure LED design with options for doping of the active and cladding layers and carrier confinement schemes.

This ordering effect may also be used in another embodiment of cladding layer design. That is, the active region may include an ordered or partially ordered ($\eta>0$) $Al_{1-x}In_xP$ layer. The cladding layers may include n and p-type doped disordered ($\eta=0$) $Al_{1-x}In_xP$ layers of the same composition, but which have higher, indirect bandgaps. The control of ordering/disordering could be achieved through growth temperature, growth rate, the use of a surfactant such as Sb, Bi or other fast diffusing extrinsic impurities such as Zn, or substrate crystallographic orientation. These embodiments are shown in FIG. 3.

A window layer, consisting of GaP or another transparent conducting layer, may be included to spread the current from the top contacts over the device. The top contact may be formed with a heavily doped GaAs layer that is etched away after metal contacts are deposited. The bottom contact may be formed through the bottom of the substrate, assuming that the substrate and buffer layers are heavily doped, or through a contact deposited on top of the last buffer layer after the device is isolated. Alternative device structures could also be used. Exact thicknesses, dopants and doping concentrations of these layers should be optimized for device performance. Growth of all or some layers may be carried out by metal-organic vapor phase epitaxy (MOVPE) or molecular beam epitaxy (MBE) techniques.

Finally, the direct bandgap of $Al_{1-x}In_xP$ also spans the green, yellow, orange, and red wavelength emission ranges. Devices with the emission of multiple visible wavelengths on the same chip can be fabricated by growing stacks of $Al_{1-x}In_xP$ devices with different compositions. In the instance where the device will be left on the virtual substrate, the $Al_{1-x}In_xP$ device layers emitting the longest wavelength of light may be grown first, followed by a compositionally graded buffer that is transparent to that wavelength, and then the next $Al_{1-x}In_xP$ device layers emitting the next longest wavelength and so on. Formation of the virtual substrate on an InP substrate may be a practical approach. In the instance where growth in compression, rather than in tension, is desired or the entire device stack will be removed from the virtual substrate after growth, the device layers may be grown in an inverted order to that described above. That is, the $Al_{1-x}In_xP$ device layers emitting the shortest wavelength may be grown first, followed by a compositionally graded buffer that is transparent to that wavelength, followed by the device layers emitting the next shortest wavelength, and so on. The virtual substrate may then be removed, unless it is transparent to all emitted wavelengths.

There may be several advantages of the embodiments described herein. For example, $Al_{1-x}In_xP$ lattice mismatched to GaAs ($0.5<x<0.7$) provides the highest direct bandgap of any of the non-nitride III-V alloys. Green wavelength emission can therefore be achieved at alloy compositions where the direct bandgap energy is several kT (~100 meV) away from the indirect bandgap, preventing efficiency loss through intervalley transfer of carriers. Another advantage may be that inexpensive GaAs, Ge or Si substrates may be used. Still another advantage may be that longer wavelength emission is also possible within the $Al_{1-x}In_xP$ system, enabling multiple wavelength emission from the same device.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

The invention claimed is:

1. An optoelectronic device comprising:
   a first device layer comprising an alloy consisting essentially of $Al_{1-x}In_xP$, wherein:
      $0.54 \leq x < 1.0$,
      the first device layer is at least partially ordered, and
      the first device layer is configured to emit light;
   a substrate comprising at least one of GaAs, Si, Ge, InP, or GaP; and
   a first compositionally-graded buffer layer comprising:
      a first step-grade buffer layer in contact with the substrate;
      a second step-grade buffer layer in contact with the first device layer, and
      between one and six additional step-grade buffer layers positioned between the substrate and the first device layer, wherein:
   the first step-grade buffer layer is substantially lattice-matched with the substrate,
   the second step-grade buffer layer is substantially lattice-matched with the first device layer, and
   each additional step-grade buffer layer has a lattice constant that is between the lattice constants of its two immediate closest neighboring step-grade buffer layers.

2. The optoelectronic device of claim 1, wherein the first device layer has a dislocation density less than about $10^6$ $cm^{-2}$.

3. The optoelectronic device of claim 1, wherein each step-grade buffer layer comprises an alloy selected from the group consisting of $Si_ySn_zGe_{1-y-z}$ and a III-V alloy.

4. The optoelectronic device of claim 1, wherein each step-grade buffer layer comprises $Ga_{1-y}In_yAs$.

5. The optoelectronic device of claim 4, wherein $0.075 \leq y \leq 0.225$ for the second step-grade buffer layer.

6. The optoelectronic device of claim 5, wherein:
   y is 0.075 for the second step grade buffer layer, and
   each step-grade buffer layer has a thickness of about 0.5 μm.

7. The optoelectronic device of claim 1, wherein each step-grade buffer layer comprises $GaBi_yAs_{1-y}$.

8. The optoelectronic device of claim 1, wherein each step-grade buffer layer comprises $Si_ySn_zGe_{1-y-z}$.

9. The optoelectronic device of claim 1, wherein the optoelectronic device is a light emitting diode (LED).

10. The optoelectronic device of claim 1, wherein the first device layer comprises a first n-type doped layer and a first p-type doped layer.

11. The optoelectronic device of claim 10, further comprising:
    a second n-type doped layer; and
    a second p-type doped layer, wherein:
    each of the second n-type doped layer and the second p-type doped layer is disordered,
    each of the second n-type doped layer and the second p-type doped layer comprises $Al_{1-y}In_yP$,
    the first device layer is positioned between the second n-type doped layer and the second p-type doped layer, and
    y is less than x.

12. The optoelectronic device of claim 1, further comprising:
    an n-type doped $Al_{1-y}In_yP$ layer; and a p-type doped $Al_{1-y}In_yP$ layer, wherein:
each of the n-type doped $Al_{1-y}In_yP$ layer and the p-type doped $Al_{1-y}In_yP$ layer is disordered;
the first device layer is positioned between the n-type doped $Al_{1-y}In_yP$ layer and the p-type doped $Al_{1-y}In_yP$ layer, and
y is less than x.

13. The optoelectronic device of claim 1, wherein the first device layer is configured to emit light in at least one of green, yellow, orange, or red spectra.

14. The optoelectronic device of claim 1, further comprising a second device layer, wherein each device layer has a composition different than the other device layer.

15. The optoelectronic device of claim 1, further comprising:
a second device layer comprising an alloy consisting essentially of $Al_{1-y}In_yP$; and
a second compositionally-graded buffer layer, wherein:
the second compositionally-graded buffer layer is positioned between the second device layer and the first device layer; and
y is not equal to x.

16. The optoelectronic device of claim 15, wherein the substrate comprises InP.

17. The optoelectronic device of claim 1, wherein $0.54 \leq x \leq 0.68$.

18. The optoelectronic device of claim 1, wherein the light has a wavelength between 540 nm and 590 nm.

19. The optoelectronic device of claim 1, wherein the light is green.

20. The optoelectronic device of claim 1, wherein the first device layer has a lattice constant between 5.68 Å and 5.74 Å.

* * * * *